US009029068B2

(12) United States Patent
Hase et al.

(10) Patent No.: US 9,029,068 B2
(45) Date of Patent: May 12, 2015

(54) PHASE CHANGE DEVICE HAVING PHASE CHANGE RECORDING FILM, AND PHASE CHANGE SWITCHING METHOD FOR PHASE CHANGE RECORDING FILM

(75) Inventors: Muneaki Hase, Tsukuba (JP); Kotaro Makino, Tsukuba (JP); Junji Tominaga, Tsukuba (JP)

(73) Assignee: University of Tsukuba, Tsukuba-shi (JP)

( * ) Notice: Subject to any disclaimer, the term of this patent is extended or adjusted under 35 U.S.C. 154(b) by 201 days.

(21) Appl. No.: 13/503,346

(22) PCT Filed: Aug. 9, 2010

(86) PCT No.: PCT/JP2010/063490
§ 371 (c)(1),
(2), (4) Date: Jun. 25, 2012

(87) PCT Pub. No.: WO2011/052279
PCT Pub. Date: May 5, 2011

(65) Prior Publication Data
US 2012/0256104 A1 Oct. 11, 2012

(30) Foreign Application Priority Data
Oct. 28, 2009 (JP) ................................. 2009-248134

(51) Int. Cl.
*G11B 7/24* (2013.01)
*G11C 13/00* (2006.01)
(Continued)

(52) U.S. Cl.
CPC ........ *G11C 13/0004* (2013.01); *G11B 7/00454* (2013.01); *G11B 2007/24316* (2013.01);
(Continued)

(58) Field of Classification Search
CPC .......... G11B 7/00454; G11B 7/24316; G11B 7/00456; G11B 7/0062; G11B 7/1395; G11B 7/243; G02B 26/001; G02B 27/0903; H01S 3/0057
See application file for complete search history.

(56) References Cited

U.S. PATENT DOCUMENTS 5,268,862 A * 12/1993 Rentzepis .................... 365/151
5,283,777 A * 2/1994 Tanno et al. .................. 369/108
(Continued)

FOREIGN PATENT DOCUMENTS

JP H05-101388 A 4/1993
JP H07-309065 A 11/1995
(Continued)

OTHER PUBLICATIONS

Misochko et al. "Coherent A1 phonons in Te studies with tailored femtosecond pulses", J. Phys. Cond. Matt., vol. 19 406220 (12 pages) (2007).*
(Continued)

*Primary Examiner* — Martin Angebranndt
(74) *Attorney, Agent, or Firm* — Law Office of Katsuhiro Arai

(57) ABSTRACT

Allowing the rate of phase change to be controlled at the time period of phonons (approx. 270 fs) for the purpose of achieving a substantially higher recording-erasing speed compared to what can be achieved with conventional technologies relating to optical recording media using phase change. A femtosecond pulse laser is shaped into pulse trains each having a first pulse and a second pulse using a Michelson interferometer, and the time interval of first and second pulses is matched with the time period of lattice vibration of a material constituting the phase change recording film to be irradiated, thereby inducing phase change.

7 Claims, 8 Drawing Sheets

(51) Int. Cl.
*G11B 7/0045* (2006.01)
*G11B 7/1395* (2012.01)
*G11C 13/04* (2006.01)
*H01L 45/00* (2006.01)
G11B 7/243 (2013.01)
G02B 26/00 (2006.01)
H01S 3/00 (2006.01)

(52) U.S. Cl.
CPC .......... *G11B7/00456* (2013.01); *G11B 7/1395* (2013.01); *G02B 26/001* (2013.01); *H01S 3/0057* (2013.01); *G11B 7/243* (2013.01); *G11C 13/04* (2013.01); *H01L 45/06* (2013.01); *H01L 45/144* (2013.01)

(56) References Cited

U.S. PATENT DOCUMENTS

| 6,570,833 | B2 * | 5/2003 | Kim et al. ............ 369/126 |
|---|---|---|---|
| 2006/0153053 | A1 | 7/2006 | Deguchi et al. |
| 2006/0256706 | A1 | 11/2006 | Ito et al. |
| 2009/0196142 | A1 | 8/2009 | Yusu et al. |
| 2010/0200828 | A1 | 8/2010 | Tominaga et al. |
| 2010/0309759 | A1 | 12/2010 | Sato et al. |

FOREIGN PATENT DOCUMENTS

| JP | H08-045076 A | 2/1996 |
|---|---|---|
| JP | 2000-322740 A | 11/2000 |
| JP | 2002-214137 A | 7/2002 |
| JP | 2003-272229 A | 9/2003 |
| JP | 2003-281723 A | 10/2003 |
| JP | 2006-168182 A | 6/2006 |
| JP | 2006-277839 A | 10/2006 |
| JP | 2009-059902 A | 3/2009 |
| JP | 2009-181649 A | 8/2009 |
| WO | 20091037773 A | 3/2009 |

OTHER PUBLICATIONS

DeCamp et al., "Dynamics and coherent control of high-amplitude optical photons is bismuth", Phys. Rev. B., vol. 64 092301 (3 pages) (Aug. 2001).*

Hase et al. "Selective enhancement of coherent optical phonons using THz-rate pulse train". Jpn. J. Appl. Phys., vol. 37 Pt2(3a) pp. L281-L283 (Mar. 1998).*

Hase et al., "Time domain study of coherent soft modes in GeTe ferroelectric using high density photoexcitation", Prsentation at Femto and attosecond phenomena in materials, Symposium KK , pp. 746-753 (Dec. 2002).*

Miyamoto et al., "Ultrafast spectroscopy of coherent optical photons in Ge2Sb2Te5 superlattices" Presentation at Ultrafast Surface Dynamics 6, Jul. 20-25, 2008 (Kloster Banz, Germany) 104 pages.*

Hase et al. "Generation of coherent THz phonons in GeTe ferroelectrics", J. Lumin., vol. 87-89 pp. 836-839 (2000).*

Mizoguchi et al. "Study of coherent LO phonon-plasmon coupled modes by double pulse excitation", J. Lumin., vol. 87-89 pp. 939-941 (2000).*

Forst et al., "Phse change in Ge2Sb2Te5 films investigated by coherent phonon spectralscopy"., Appl. Phys. Lett., vol. 77(13) pp. 19641966 (Sep. 2000).*

Dekorsy et al., "Coherent control of LO phonon dynemics in popaque semiconductors by femtosecond laser pulses"., Europhys. Lett., vol. 23(3) pp. 223-228 (Jul. 1993).*

Santo et al. "Sub-picosecond non-melting structure change in a GeSbTe film induced by femtosecond pulse excitation" E/PCOS2009 proceedings p. 9-13 (presented Sep. 7, 2009).*

Hase et al., "Ultrafast dynamics of coherent optical phonons and nonequilibrium electrons in transition metals", Phys. Rev. B., vol. 71 184301-1 to 184301-9 (2005) (supplied by applicant).*

Makino, et al., "Control of coherent phonon using double pulse inGe2Sb2Te5", Meeting Abstracts of the Physical Society of Japan, vol. 64, Issue 2, Part 4, p. 673 (27pXB-7), published Aug. 18, 2009.

Hase, et al., "Optical control of coherent optical phonons in bismuth films", Appl. Phys. Lett. vol. 69 (17), 2474-2476, Oct. 21, 1996.

Hase, et al., "Forcibly driven coherent soft phonons in GeTe with intense THz-rate pump fields", Appl. Phys. Lett. vol. 83 (24), 4921-4923, Dec. 15, 2003.

Kolobov, et al., "Understanding the phase-change mechanism of rewritable optical media", Nature Materials vol. 3,703 (Sep. 12, 2004).

The International Search Report (ISR) mailed on Sep. 21, 2010, issued by the Japanese Patent Office for International Patent Application PCT/JP2010/063490.

* cited by examiner

Fig. 1
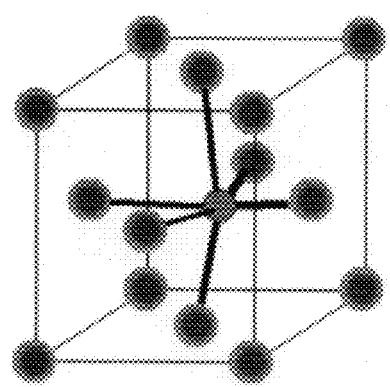
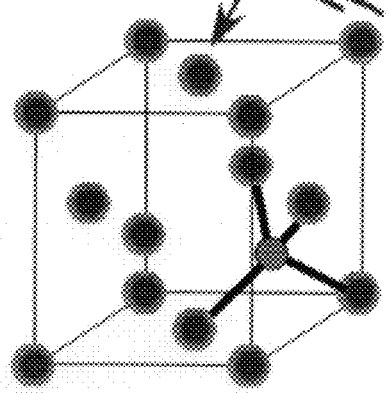

Fig. 2
(a)
(b)
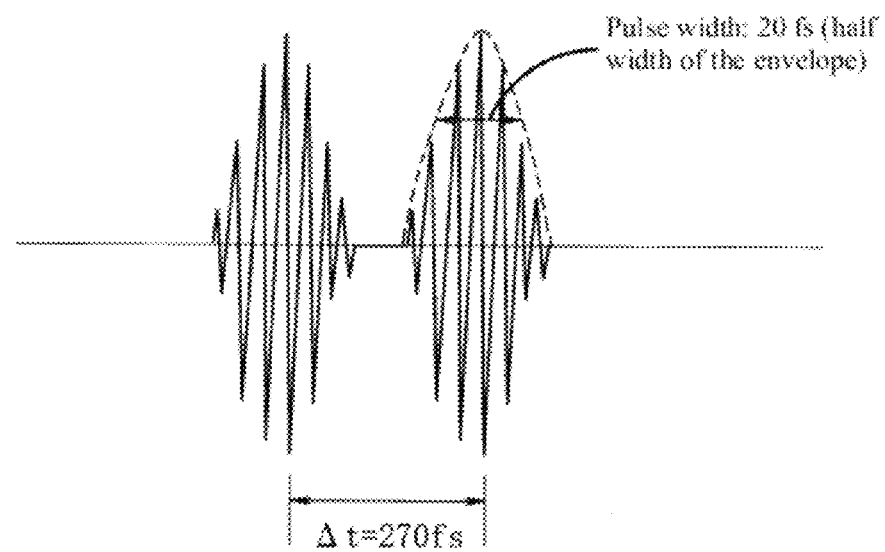
(c)
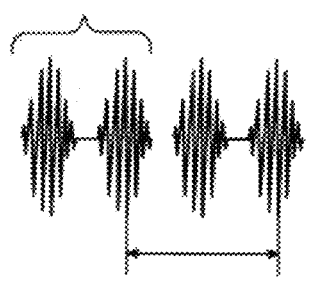

PHASE CHANGE DEVICE HAVING PHASE CHANGE RECORDING FILM, AND PHASE CHANGE SWITCHING METHOD FOR PHASE CHANGE RECORDING FILM

This application is the U.S. National Phase under 35 U.S.C. §371 of International Application PCT/JP2010/063490, filed Aug. 9, 2010, which claims priority to Japanese Patent Application No. 2009-248134, filed Oct. 28, 2009. The International Application was published under PCT Article 21(2) in a language other than English.

TECHNICAL FIELD

Phase change recording film materials used in optical recording media such as DVD-RAMs and in solid-state electrical memories called solid-state phase change memories (PCRAMs), etc., are subject to phase change between crystalline and amorphous states. The present invention relates to a phase change device having a phase change recording film subject to this phase change, as well as a phase change switching method whereby phase change is induced in a phase change recording film.

BACKGROUND ART

Recording films used in optical recording media, representative of which are DVD-RAMs, and in solid-state phase change memories (PCRAMs), are made of a chemical compound called "calcogen" whose main constituent is Te or Sb, where technology has been established whereby a pulsed laser beam such as semiconductor laser or pulse current is irradiated into a thin film made of this material having a thickness of approx. 20 nanometers to raise the film temperature to the melting point or above to cause phase change from crystalline to amorphous states, or vice versa.

Traditionally signals are recorded and regenerated by utilizing the differential reflectance (differential refraction factor) between crystalline and amorphous states.

Technologies relating to optical recording media using phase change are known (refer to Patent Literatures 1 to 8, for example). Today, ternary chemical compounds (Ge—Sb—Te materials) and quaternary chemical compounds (Ag—In—Sb—Te materials) that allow for at least one million recording-erasing cycles are already put to practical use.

In the meantime, coherent phonons are known to be generated when a femtosecond pulse laser is irradiated onto a solid matter (refer to Patent Literature 9, for example), and the amplitude of these coherent phonons is known to be controllable by optical pulse trains (refer to Non-patent Literatures 1 and 2). Studies are also conducted to shed light on the phase change process in phase change optical recording film materials (refer to Non-Patent Literature 3).

BACKGROUND ART LITERATURES

Patent Literatures

Patent Literature 1: Japanese Patent Laid-open No. Hei 5-101388
Patent Literature 2: Japanese Patent Laid-open No. Hei 7-309065
Patent Literature 3: Japanese Patent Laid-open No. Hei 8-45076
Patent Literature 4: Japanese Patent Laid-open No. 2000-322740
Patent Literature 5: Japanese Patent Laid-open No. 2003-272229
Patent Literature 6: Japanese Patent Laid-open No. 2003-281723
Patent Literature 7: Japanese Patent Laid-open No. 2006-168182
Patent Literature 8: Japanese Patent Laid-open No. 2006-277839
Patent Literature 9: Japanese Patent Laid-open No. 2002-214137
Patent Literature 10: Japanese Patent Laid-open No. 2009-59902

Non-Patent Literatures

Non-patent Literature 1: Appl. Phys. Lett. Vol. 69, 2474 (1996)
Non-patent Literature 2: Appl. Phys. Lett. Vol. 83, 4921 (2003)
Non-patent Literature 3: A. V. Kolobov, P Fons, A. I. Frenkel, A. L. Ankudinov, J. Tominaga, T. Uruga, Nature Materials Vol. 3, 703 (2004)

SUMMARY OF THE INVENTION

Problems to be Solved by the Invention

Conventional technologies relating to optical recording media using phase change, such as those illustrated in Patent Literatures 1 to 7 above, cause a phase change process by raising the temperature by means of laser irradiation or heating with electrical current. Accordingly, the recording speed is limited by the rotating speed of the disc and rate of thermal phase change. Typical recording line speeds are anywhere from approx. 20 m/s (approx. 6×) to 60 m/s (approx. 17×), as mentioned in Patent Literature 7 (Japanese Patent Laid-open No. 2006-168182), and these speeds roughly correspond to 50 ns.

However, the rate of phase change in Ge—Sb—Te materials, which are representative substances used as phase change optical recording film materials, is predicted to be 1 nanosecond ($10^{-9}$ second) or less, which is too fast for thermal phase change, and accordingly active studies have been conducted in recent years to shed light on the phase change process (refer to Non-patent Literature 3, for example). In other words, details of the mechanism of how phase change occurs in materials already used in practical applications such as DVD-RAMs are still unclear.

The present invention aims to achieve a substantially higher recording-erasing speed compared to what can be achieved with conventional technologies relating to optical recording media using phase change, and the object of the present invention is to embody a technology through which the rate of phase change can be controlled at the time period of lattice vibration (phonons) (approx. 270 fs) in a phase change recording film.

To be specific, the object of the present invention is to embody a phase change device having phase change recording film whose rate of phase change is controlled at the time period of phonons (approx. 270 fs) by means of coherent control of the motion of atoms using laser pulse trains having a femtosecond time interval that allows for sufficient time-resolving of phase change at 1 nanosecond or less, as well as a phase change switching method whereby phase change is induced in a phase change recording film.

Means for Solving the Problems

To achieve the above object, the present invention provides a phase change device having phase change recording film, comprising a phase change recording film and a means for feeding a femtosecond pulse laser and irradiating it onto the phase change recording film; wherein such phase change device having phase change recording film is characterized in that the aforementioned means is configured to shape the femtosecond pulse laser into pulse trains and irradiate the laser by matching the time interval of pulse trains with the time period of lattice vibration of the material constituting the phase change recording film, thereby inducing phase change in the phase change recording film.

To achieve the above object, the present invention provides a phase change device having phase change recording film, comprising a phase change recording film and a means for irradiating a femtosecond pulse laser onto the phase change recording film; wherein such phase change device having phase change recording film is characterized in that the aforementioned means is configured to shape the femtosecond pulse laser into pulse trains each having a first pulse and a second pulse and to irradiate the laser by matching the time interval of first and second pulses corresponding to the time interval of pulse trains, with the time period of lattice vibration of the material constituting the phase change recording film, thereby inducing phase change in the phase change recording film.

Preferably the time interval of pulse trains is set to the characteristic vibration frequency in the phonon mode that manifests prominently after the phase change from amorphous to crystal or from crystal to amorphous states.

Preferably the condition of the phase change is controlled by changing the intensity of the second pulse.

Preferably the phase change recording film is formed on a silicon wafer and the pulse trains are introduced via an optical waveguide formed on the silicon wafer to be irradiated onto the phase change recording film.

Preferably the femtosecond pulse laser is split by a Michelson interferometer, Mach-Zender interferometer, or pulse shaper using liquid crystal optical modulation elements, and shaped into pulse trains having a femtosecond time interval.

Preferably the material constituting the phase change recording film is $Ge_2Sb_2Te_5$ and the time interval $\Delta t$ of pulse trains is set to 276 fs (=3.62 THz) according to the time period of lattice vibration locally present in the $GeTe_4$ lattice containing a Ge atom. It should be noted, however, that $\Delta t$ is not limited to 276 fs and can be set in a range of 270 fs to 278 fs (or in a frequency range of 3.6 to 3.7 THz).

To achieve the above object, the present invention provides a phase change switching method for causing phase change in a phase change recording film by irradiating a femtosecond pulse laser onto a phase change recording film; wherein such phase change switching method for causing phase change in a phase change recording film is characterized in that the femtosecond pulse laser is shaped into pulse trains and irradiated by matching the time interval of pulse trains with the time period of lattice vibration of the material constituting the phase change recording film, thereby inducing phase change in the phase change recording film.

To achieve the above object, the present invention provides a phase change switching method for causing phase change in a phase change recording film by irradiating a femtosecond pulse laser onto a phase change recording film; wherein such phase change switching method for causing phase change in a phase change recording film is characterized in that the femtosecond pulse laser is shaped into pulse trains each having a first pulse and a second pulse and irradiated by matching the time interval of first and second pulses corresponding to the time interval of pulse trains, with the time period of lattice vibration of the material constituting the phase change recording film, thereby inducing phase change in the phase change recording film.

Preferably the time interval of pulse trains is set to the characteristic vibration frequency in the phonon mode that manifests prominently after the phase change from amorphous to crystal or from crystal to amorphous states.

Preferably the condition of the phase change is controlled by changing the intensity of the second pulse.

Preferably the femtosecond pulse laser is split by a Michelson interferometer, Mach-Zender interferometer, or pulse shaper using liquid crystal optical modulation elements, and shaped into pulse trains having a femtosecond time interval.

Preferably the material constituting the phase change recording film is $Ge_2Sb_2Te_5$ and the time interval $\Delta t$ is set to 276 fs (=3.62 THz) according to the time period of lattice vibration locally present in the $GeTe_4$ lattice containing a Ge atom. It should be noted, however, that $\Delta t$ is not limited to 276 fs and can be set in a range of 270 fs to 278 fs (or in a frequency range of 3.6 to 3.7 THz).

Effects of the Invention

The present invention has the following effects:
(1) By irradiating a laser onto a phase change recording film that can be applied as an optical recording film or solid-state phase change memory (electrical memory), phase change can be induced at an ultrahigh speed in femtoseconds (corresponding to a frequency in terahertz (1 terahertz=$10^{12}$ Hz)), so the phase change rewrite speed can be substantially improved.
(2) Since phase change from crystal to amorphous or from amorphous to crystal states can be induced at an ultrahigh speed in femtoseconds, a high-speed solid-state phase change memory that can be written and cleared at a terahertz frequency can be created.
(3) Phase change can be induced also by using a femtosecond pulse laser emitted from a compact non-amplification-type femtosecond pulse laser light source as an excitation light (of 31 mW or less in power), which is very power-efficient. If femtosecond pulse laser emitted from an even smaller fiber-type femtosecond pulse laser light source can be used as an excitation light, a high-speed recording-erasing device offering general utility can be created.

BRIEF DESCRIPTION OF THE DRAWINGS

FIG. 1 (a) is a drawing explaining the principles of femtosecond laser pulse control based on umbrella flip-flop transition under the present invention, while (b) is a schematic drawing showing how the Ge atom is displaced in phase change from amorphous to crystal states.

FIG. 2 Drawing explaining the relationship of a femtosecond pulse laser received from a laser pulse light source on one hand, and on the other, a laser pulse train having a femtosecond time interval obtained by shaping the laser.

MODE FOR CARRYING OUT THE INVENTION

Figure 3:
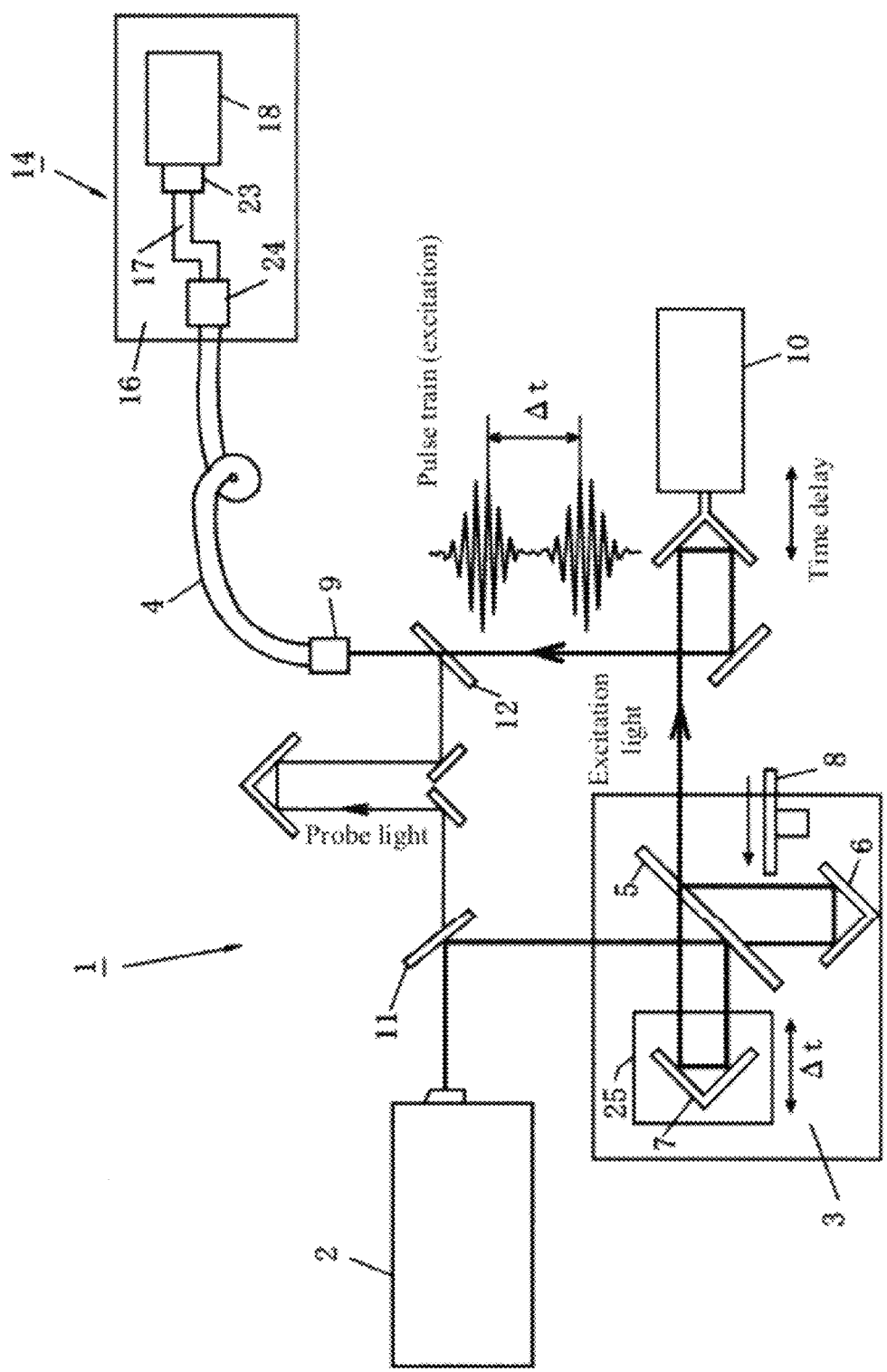
FIG. 3 Drawing explaining the configuration of a femtosecond pulse laser feed unit conforming to the present invention.

Modes for implementing a phase change device having phase change recording film and a phase change switching method for phase change recording film according to the present invention are explained below based on examples by referring to the drawings.

(Principles, Basic Constitution, Etc. of the Present Invention)

The frequency of lattice vibration (phonons), which represents collective motion of atoms, is very sensitive to the structural change of a solid matter and therefore Raman scattering spectroscopy and coherent phonon spectroscopy have been used to measure the dynamic process of structural phase transition in ferroelectrics, etc. Among others, application of Raman scattering to optical recording film materials is reported in Japanese Patent Laid-open Nos. Hei 07-141693 and Hei 10-166738, for example.

However, there are not many examples of using coherent phonon spectroscopy with a femtosecond pulse laser (laser having a femtosecond pulse width (fs: $10^{-15}$ sec) as a light source to measure the dynamic process of phase change in optical recording film materials, where limited examples include those reported in Non-patent Literatures "M. Forst, T. Dekorsy, C. Trappe, M. Laurenzis, H. Kurz and B. Bechevet, Appl. Phys. Lett. Vol. 77. 1964 (2000)" and "M. Hase, Y. Miyamoto and J. Tominaga, Phys. Rev. B Vol. 79, 174112 (2009)."

After studying in earnest to shed light on the phase change process, the inventor of the present invention gained an insight that, by synchronizing the time interval Δt of excitation laser pulse trains shown in FIG. 1(a) (if the laser pulse train contains two pulses, this should be the time interval Δt between these two pulses) with the time period (vibration frequency) of phonons (lattice vibrations) directly involved in the phase change in a phase change recording film material, the phonon amplitude can be controlled and phase change can be caused at high speed (within 1 ns) not by a thermal process, but by a non-thermal (coherent) process.

Based on this insight, the inventor of the present invention thought out a phase change device having phase change recording film that forcibly generates a phase change switch at ultrahigh speed in femtoseconds by introducing coherent phonons (non-thermal lattice vibration) to a phase change recording film to be used as a phase change device and implementing optical control, as well as a phase change switching method for phase change recording film.

To be more specific, the phase change device having phase change recording film and phase change switching method for phase change recording film proposed by the present invention are such that a Michelson interferometer, Mach-Zender interferometer, pulse waveform shaper using liquid crystal optical modulation elements, etc., are used to shape a femtosecond pulse laser beam (referred to as "femtosecond pulse laser" in this Specification) into laser pulse trains (excitation laser pulse trains) having a femtosecond time interval and these laser pulse trains are irradiated repeatedly onto a phase change recording film as an excitation light, thereby forcibly causing phase change at ultrahigh speed in femtoseconds.

Here, if a Michelson interferometer or Mach-Zender interferometer is used, at least one of the pair of mirrors constituting the interferometer placed on a motorized stage or piezo-stage is moved at a precision of approx. 1 μm to control the time interval of laser pulse trains (double pulses in the case of an interferometer).

If a pulse waveform shaper using liquid crystal optical modulation elements is used, on the other hand, typically an appropriate phase and amplitude modulation pattern are given to the liquid crystal optical modulation elements having 128-channel panels to allow for shaping of laser pulse trains having any time interval equivalent to up to around 10 shots, as described in Non-patent Literatures (A. M. Weiner, D. E. Leaird, J. S. Patel and J. R. Wullert, II: IEEE J. Quantum Electron. 28, 908 (1992), and M. Hase, T. Itano, K. Mizoguchi and S. Nakashima, Jpn. J. Appl. Phys. 37, L281 (1998)). If 10 shots are output in the above case, approx. 2760 fs is needed to irradiate the first through tenth excitation pulses.

It should be noted that in the examples of the present invention described later, a constitution whereby a Michelson interferometer is used to shape laser into two shots of laser pulse trains (two excitation pulses) having a femtosecond time interval and these two shots of laser pulse trains (two excitation pulses) are irradiated repeatedly is explained.

Here, by synchronizing the time interval of laser pulse trains with the time interval (vibration frequency) in the phonon mode directly involved in phase change ($A_1$ mode due to the GeTe$_4$ structure; here, the "$A_1$ mode" spectrographically means "totally symmetric mode"), the phonon amplitude can be controlled and the phase change process can be induced at high speed through a non-thermal (coherent) process, not a thermal process. If a pulse waveform shaper using liquid crystal optical modulation elements is used, laser can be shaped into laser pulse trains equivalent to up to around 10 shots, but even in this case it is essential to synchronize the time interval of laser pulse trains with the time period (vibration frequency) in the phonon mode directly involved in phase change.

Preferably the phonon mode to be synchronized with is the most intense mode manifesting after the phase change, for example. To be specific, if the phase change recording film material is Ge$_2$Sb$_2$Te$_5$ where phase change occurs from amorphous to crystal states, the vibration mode of 3.7 THz in frequency that manifests prominently after the phase change is a desired synchronization target. This vibration mode represents phonon vibration locally present in the GeTe$_4$ lattice containing a Ge atom, which is considered to play a central role in the phase change model. Not only when Ge$_2$Sb$_2$Te$_5$ is used, but also when Ge$_1$Sb$_2$Te$_5$, Ge$_1$Sb$_4$Te$_7$ or any other Ge—Sb—Te material is used, the characteristic vibration frequency of the phonon mode that manifests prominently after the phase change from amorphous to crystal states (or vice versa) should be a desired synchronization target.

Under the present invention, when the number of pulses constituting each shaped laser pulse train having a femtosecond time interval is two (the femtosecond pulse laser beam is split into two using a Michelson interferometer, etc.), or specifically when there are a first pulse and second pulse as shown in FIG. 1(a), the optical intensity of the second pulse can be changed to successively control the condition of phase change.

Here, the relationship of "femtosecond pulse laser" received from a laser pulse light source on one hand, and on the other, "laser pulse train having a femtosecond time interval" obtained by shaping the laser is explained using FIG. 2. For example, a femtosecond pulse laser having a period of 80 MHz and infinite pulses (refer to FIG. 2(a)) is split into two using a Michelson interferometer, etc., at a femtosecond time interval (such as 270 fs) in between, and shaped into "laser pulse trains having femtosecond time intervals" each consisting of two excitation pulses (first pulse and second pulse) (refer to FIG. 2(b)). The means for shaping laser pulse trains, each consisting of two excitation pulses having a femtosecond time interval, is explained in detail using the examples and FIG. 3 later.

Then, this pulse train consisting of two excitation pulses is irradiated repeatedly (refer to FIG. 2(c)) onto a phase change recording film. The cycle period of the pulse train consisting of two excitation pulses is approx. 80 MHz, for example (refer to FIG. 2(c)). This means that two excitation pulses (a pair) are irradiated repeatedly at 80 MHz.

The mechanism of successively controlling the condition of phase change is such that the first pulse induces coherent phonons in the substance structure of the target phase change recording film to give coherent oscillations, while the second pulse changes the phase change condition of the substance in stages according to the intensity of the pulse.

To reliably time-resolve the high-frequency phonons in the terahertz frequency range and measure them as a damping vibration waveform in femtoseconds in real time (thereby measuring the condition of lattice vibration (condition of phase change) in femtoseconds in real time), preferably the pulse width of the femtosecond pulse laser is 100 fs (or 20 fs or less, if possible) (refer to FIG. 2(b)).

In addition, the wavelength (energy) of the femtosecond pulse laser is preferably equal to or greater than the band gap energy of the substance constituting the phase change recording film, and in the case of a Ge—Sb—Te phase change recording film material having a band gap energy of approx. 0.5 to 0.7 eV, electrons and coherent phonons can be excited without problem at the center wavelength of any normal titanium-sapphire laser ranging from 750 to 900 nm (1.65 to 1.38 eV).

Furthermore, the cycle period of the laser pulse train obtained by shaping the femtosecond pulse laser should be longer than the time scale of phase change (within 1 ns), and this cycle period must be 1 GHz or less in frequency. Typically a non-amplification-type titanium-sapphire laser uses a repetition rate of approx. 70 to 80 MHz (refer to the example of 80 MHz in FIG. 2(c)), while the repetition rate of an amplification-type titanium-sapphire laser is approx. 1 kHz to 1 MHz.

As explained above, the present invention allows the phonon amplitude to be controlled by synchronizing the time interval of laser pulse trains (time interval of the two pulses contained in each laser pulse train) to induce phase change (trigger phase change switching) at ultrahigh speed in femtoseconds through a coherent (non-thermal) process, but the condition of this phase change must be measured in real time to demonstrate the effects of the present invention.

However, Raman scattering spectroscopy, infrared spectroscopy and other conventional phonon measurement means basically identify a structural change between before and after a phase change and using these means to track any structural change caused by an ultrahigh-speed phase change in femtoseconds is extremely difficult. Therefore, in the R&D phase of the present invention the time-resolved reflectance measurement means based on pump-probe spectroscopy was used to measure phase change and demonstrate the effects of the present invention.

In other words, for the present invention the time-resolved reflectance measurement means based on pump-probe spectroscopy using a femtosecond pulse laser as a light source was used to measure coherent phonons in order to measure, in real time, the condition of ultrahigh-speed phase change occurring in a phase change recording film material at a speed of 1 nanosecond ($10^{-9}$ second) or less. Pump-probe spectroscopy is a means for observing a phenomenon occurring at high speed, such as chemical reaction, by resolving the phenomenon by time, and it is a known technology. Time-resolved reflectance measurement using this pump-probe spectroscopy is also known (refer to Patent Literature 9, for example).

Under the time-resolved reflectance measurement means, femtosecond pulse laser is used as a pump beam (excitation light) and probe beam (probe light) and at least one of these pump beam and probe beam is time-delayed by an optical delay line, so that coherent phonons are excited as coherent lattice vibration in the phase change recording film material by irradiating the pump beam onto the phase change recording film material through condensing of light using a lens or concave mirror, after which the probe beam is irradiated onto the solid sample through condensing of light using a lens or concave mirror to measure the change in reflectance of the phase change recording film material.

As mentioned earlier, based on the mechanism of phase change as described in Non-patent Literature 3 and Patent Literature 10, the structural change accompanying the phase change can be identified by femtoseconds in real time by, in the case of a Ge—Sb—Te material, measuring the change in phonon frequency, etc., caused by a transition from phonons due to the $GeTe_4$ structure containing a Ge atom ($A_1$ mode: totally symmetric mode) to phonons due to the $GeTe_6$ structure ($A_1$ mode: totally symmetric mode) by assuming a model whereby the Ge atom in the base unit lattice displaces slightly (umbrella flip-flop transition: refer to FIG. 1(a)).

As long as the lattice vibration (phonons) directly involved in the phase change can be measured in real time this way, the dynamic process of phase change (structural change accompanying the phase change) can be identified from the change in phonon vibrational frequency. This requires a means for integrating and monitoring coherent phonon signals, where use of a fast scanning means capable of monitoring coherent phonons in real time (refer to Japanese Patent Laid-open No. 2004-226224) is desired.

EXAMPLE 1

Example 1 of the phase change device having phase change recording film and phase change switching method for phase change recording film proposed by the present invention is explained below. The phase change device having phase change recording film conforming to the present invention has a femtosecond pulse laser feed unit 1 and a phase change unit 14, as shown in FIG. 3.

Figure 8:
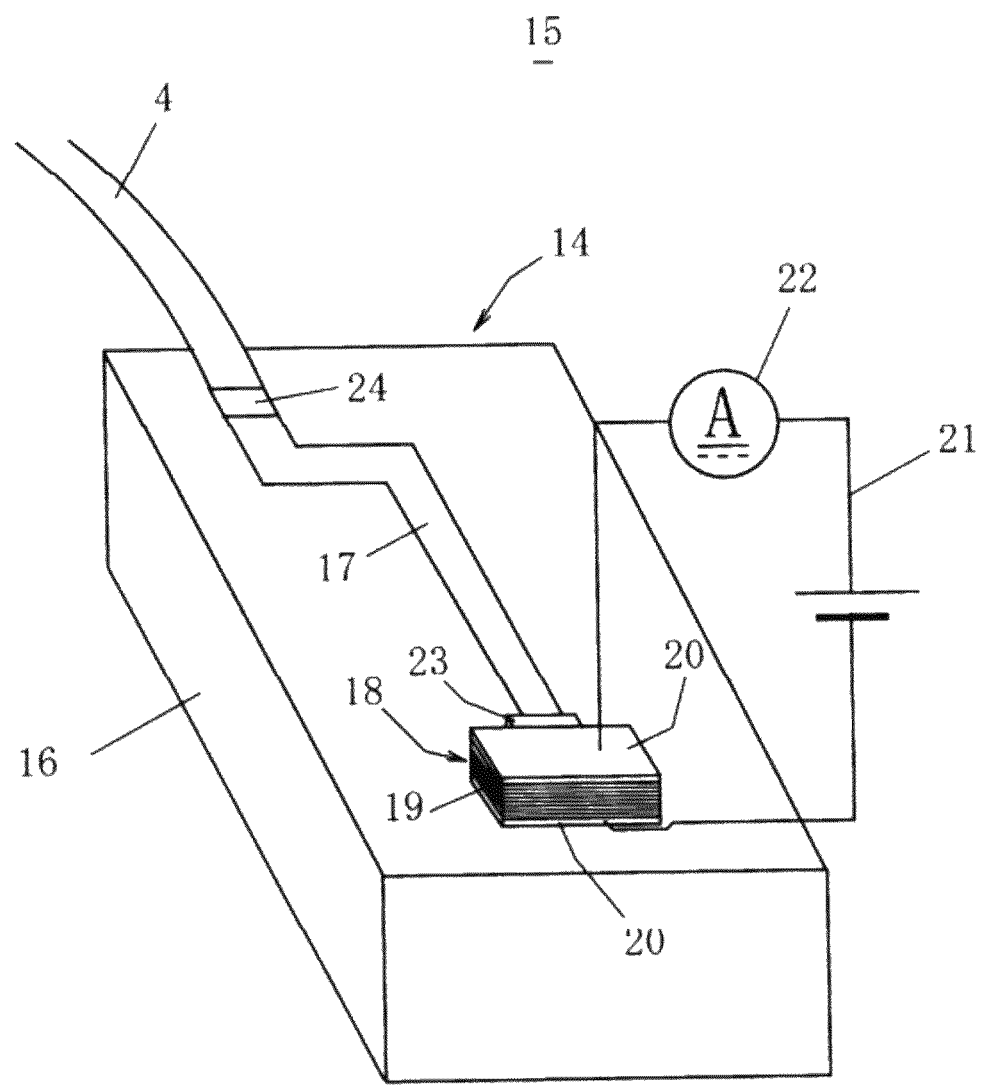
FIG. 8 Drawing showing the configuration of a phase change unit conforming to the present invention.

As shown in FIG. 8 illustrating Example 2 explained later, the phase change unit 14 has a silicon wafer 16 being the substrate, a phase change recording film 18 used as a phase change device, and an optical waveguide 17.

In Example 1, the phase change recording film 18 is formed on the silicon wafer 16 and constituted by a super-lattice thin film of $Ge_2Sb_2Te_5$. To be specific, this super-lattice thin film has a repetitive structure made of $GeTe/Sb_2Te_3$ phase change thin films 19. In other words, the super-lattice thin film has a multi-layer structure where 20-layers GeTe phase change thin films 19 and 20-layers $Sb_2Te_3$ phase change thin films 19 are stacked alternately. In Example 1, the thickness of one layer is approx. 0.5 nm for both the GeTe layer and $Sb_2Te_3$ layer.

The optical waveguide 17 is formed on the silicon wafer 16, with the output end of the optical waveguide 17 connected to the phase change recording film 18 via a coupling element 23 (or coupling agent), and input end of the optical waveguide 17 connected to an optical fiber 4 via a coupling element 24 (or coupling agent). The optical waveguide 17 introduces laser pulse trains having a femtosecond time interval obtained by shaping a femtosecond pulse laser from a light source 2 using a Michelson interferometer 3, etc., and irradiates the laser pulse trains onto the end face of the phase change recording film 18 via the coupling element 23 (or coupling agent).

The phase change device having phase change recording film 18 conforming to the present invention is utilized as an optical recording device, an ultrahigh-speed switch that turns on/off electrical current by utilizing a switching function based on phase change, or solid-state phase change memory (digital memory) using phase change, etc.

As shown in FIG. 3, the femtosecond pulse laser feed unit 1 has a femtosecond pulse laser light source 2 that generates a femtosecond pulse laser, a Michelson interferometer 3, and an optical fiber 4 that introduces the femtosecond pulse laser into the optical waveguide 17. The Michelson interferometer 3 has a half-mirror 5 and two mirrors 6, 7 (pair of mirrors), and a high-speed switching shutter 8 is provided in the optical path of the one mirror 6. In addition, a motorized stage 25 (or piezo-stage) is set below the other mirror 7 to time-delay the excitation pulses (Δt) from one of the two mirrors 6, 7.

Moreover, a moving mirror 10 is provided in the optical path between the Michelson interferometer 3 and a coupling element 9 on the input side of the optical fiber 4, to time-delay the probe light (probe beam) relative to the excitation light pulse trains from the Michelson interferometer 3.

The femtosecond pulse laser from the light source 2 is shaped into laser pulse trains, each consisting of two excitation pulses having a femtosecond time interval (refer to FIG. 2(b)), and this laser pulse train is input to the optical fiber 4 via the coupling element 9 multiple times repeatedly (refer to FIG. 2(c)). The time interval Δt of two pulses is controlled by moving the moving mirror 7 at an accuracy of approx. 1 μm.

Additionally, as shown in FIG. 3, this femtosecond pulse laser feed unit 1 has a beam splitter 11 that splits the laser into excitation light and probe light, and another beam splitter 12 that combines excitation light and probe light again, and also constitutes a time-resolved reflectance measurement means.

In Example 1, the femtosecond pulse laser (refer to FIG. 2(a)) fed from the femtosecond pulse laser light source 2 has a pulse width of 20 fs, center wavelength of 850 nm and repetition rate of 80 MHz, and 2,000 signal integrations are performed during fast scan by the time-resolved reflectance measurement means.

(Action)

To illustrate the constitution of Example 1 more clearly, its action is explained together with measurement examples. As mentioned earlier, time-resolved reflectance measurement uses a femtosecond pulse laser of 20 fs in pulse width, 850 nm in center wavelength and 80 MHz in repetition rate, and 2,000 signal integrations are performed during fast scan.

Figure 4:
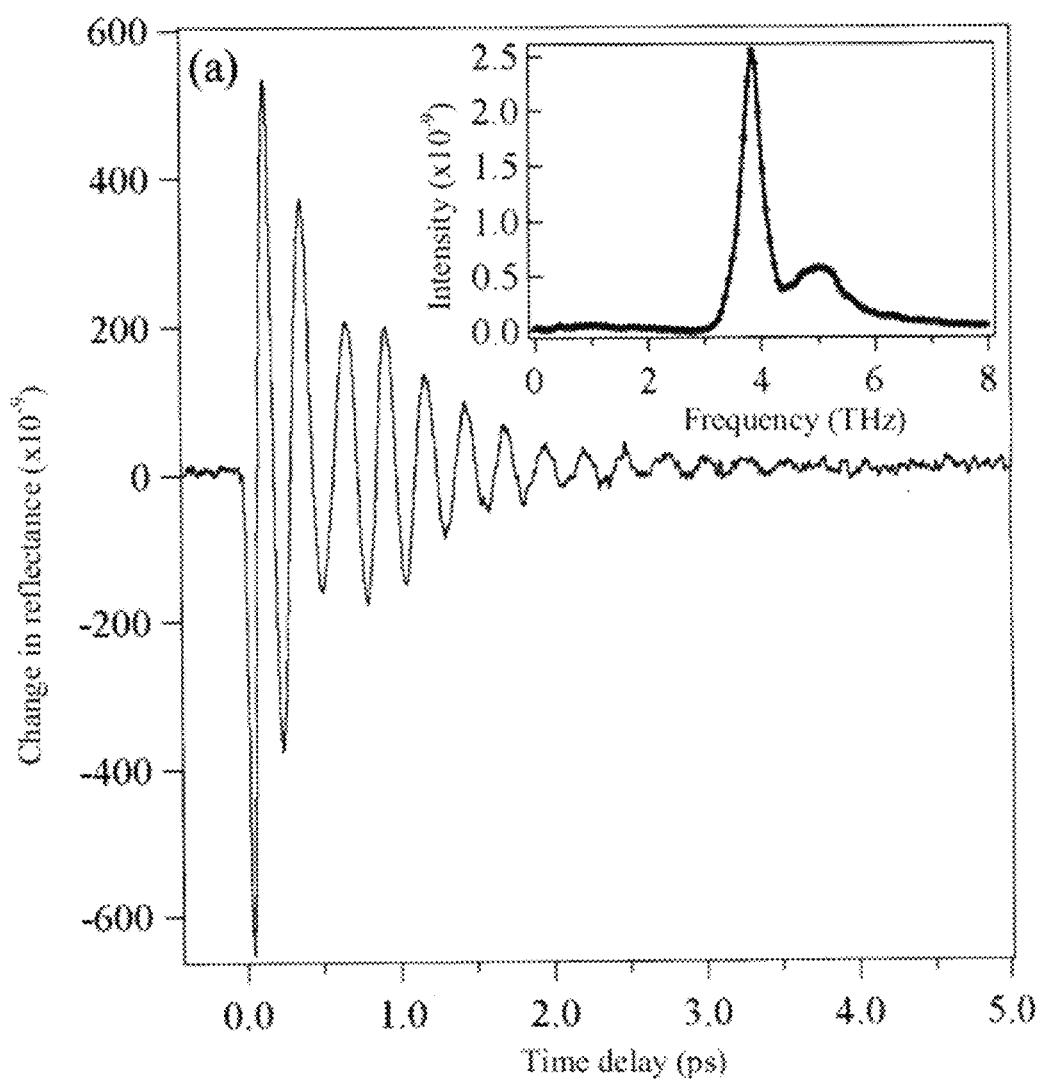
FIG. 4 Graph of time-resolved reflectance measurement signals in amorphous state based on single-pulse irradiation, and an inset graph showing a Fourier transformation spectrum of these signals.

Time-resolved reflectance measurement where pulses that excite the phase change recording film 18 are first cut off using a shutter 8, etc., at the Michelson interferometer 3 to be converted to single pulses (intensity of 31 mW) arriving at a cycle period of 80 MHz, and these pulses are irradiated onto the phase change recording film, is explained. FIG. 4 shows the result of this time-resolved reflectance measurement. Here, the structure of the phase change recording film had been reset (to an amorphous state) beforehand. As shown in FIG. 4, coherent phonon signals appear as vibration components over a time period of several picoseconds.

As seen in the Fourier transformation spectrum (inset graph in FIG. 4) of the above, there is a strong peak around 3.8 THz, and a wide, weak peak near 4.9 THz. These peaks represent the $A_1$ mode due to the $GeTe_4$ structure and $A_1$ mode due to the chain structure of randomly connected Te atoms, respectively.

Next, time-resolved reflectance measurement where a femtosecond pulse laser is split into laser pulse trains having a femtosecond time interval (double pulses consisting of first and second pulses) using the Michelson interferometer 3 (refer to FIG. 2(b)), and this laser pulse train is irradiated onto the end face of the phase change recording film 18 via the coupling element 9, optical fiber 4, coupling element 24 (or coupling agent), optical waveguide 17 and coupling element 23 (or coupling agent) repeatedly (refer to FIG. 2(c)), is explained.

Figure 5:
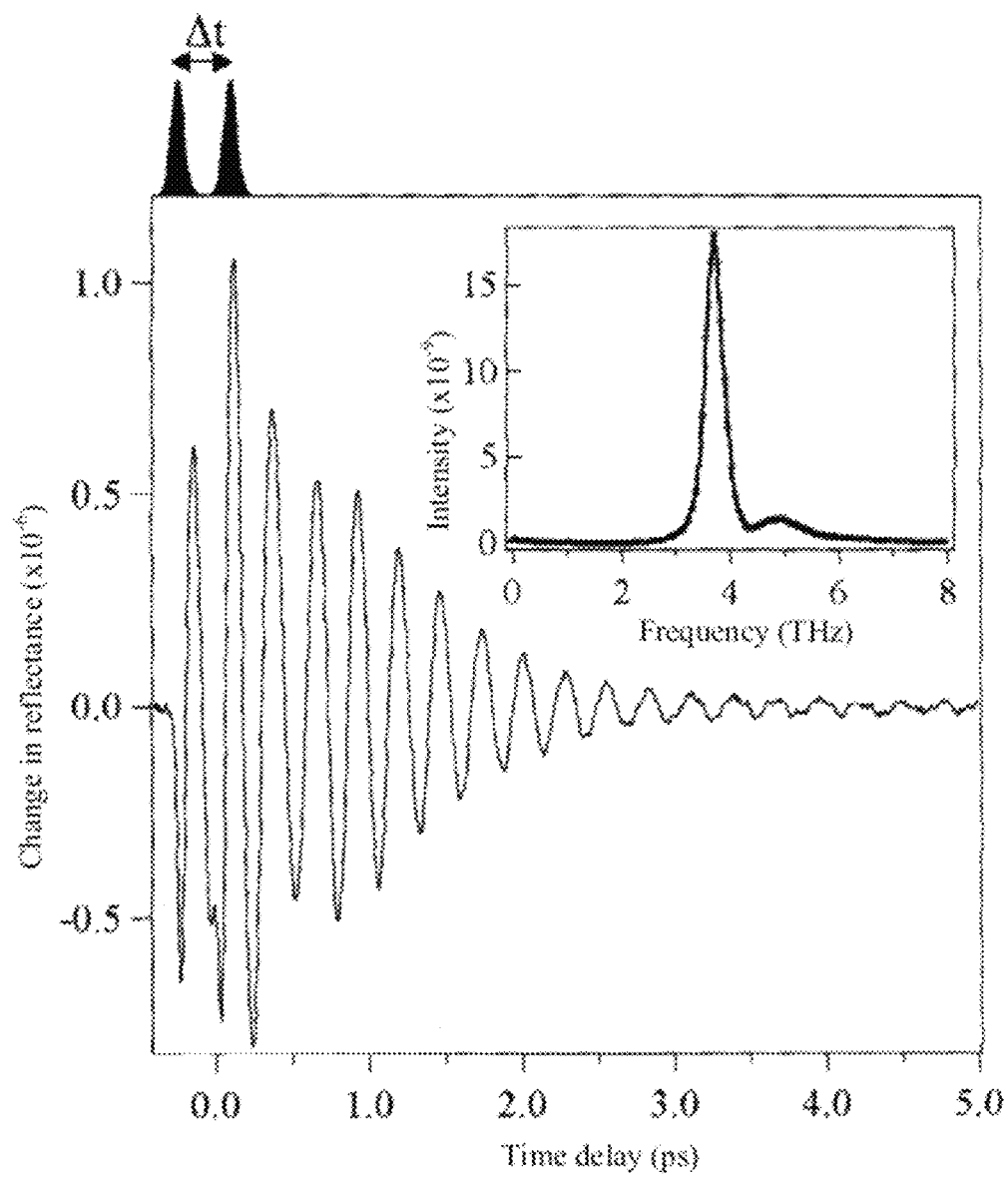
FIG. 5 Graph of time-resolved reflectance measurement signals based on double-pulse irradiation, and an inset graph showing a Fourier transformation spectrum of these signals.

In Example 1, the result of time-resolved reflectance measurement where the time interval (Δt) of laser pulse trains (double pulses) is set to 276 fs (=3.62 THz) is shown in FIG. 5. As shown in FIG. 5, the vibration amplitude increases in the time domain, while in the frequency domain the mode near 3.8 THz is sharper and the peak frequency is shifted (more detailed analysis of frequency shift is described in connection with FIG. 6 and thereafter).

Figure 6:
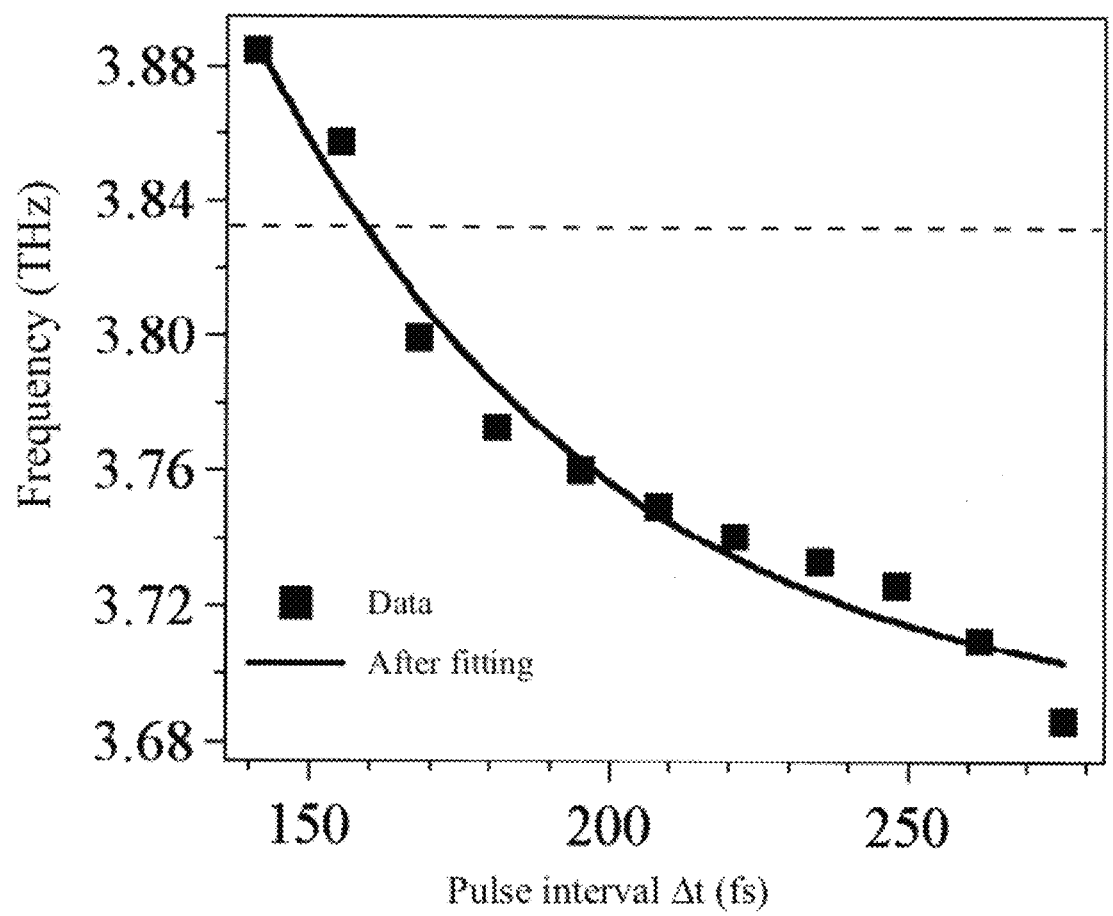
FIG. 6 Graph showing how the phonon frequency changes when the double-pulse time interval is changed.

Next, FIG. 6 shows how the coherent phonon frequency changes when the time interval Δt of laser pulse trains (double pulses) generated by the Michelson interferometer 3 is changed. At this time, the pulse intensity is equivalent to the intensity of the above single pulse and is 31 mW with both the first excitation pulse and second excitation pulse.

In FIG. 6, the dotted line (3.83 THz) indicates only the above single pulse shown in FIG. 4, but clearly the frequency shifts to approx. 3.7 THz toward the low-frequency side as the time interval Δt of laser pulse trains increases from 130 fs to 276 fs.

Incidentally, the $A_1$ mode frequency due to the $GeTe_6$ structure of the thin film super-lattice of $Ge_2Sb_2Te_5$ in crystalline states is known to be approx. 3.7 THz, so FIG. 5 indicates that a phase change from amorphous to crystalline states occurred due to laser pulse trains (double pulses) resonantly at ultrahigh speed over a period of 280 fs or less.

Additionally when coherent phonons were measured by cutting the second pulse immediately after the measurement of Δt=276 fs in FIG. 6, the $A_1$ mode frequency due to the $GeTe_6$ structure was still 3.7 THz. In other words, the phase change from amorphous to crystalline states induced by excitation of laser pulse trains is held for a long period of time after cutting the double pulses, meaning that it is not reversible where the original state is restored after some time, but irreversible.

Figure 7:
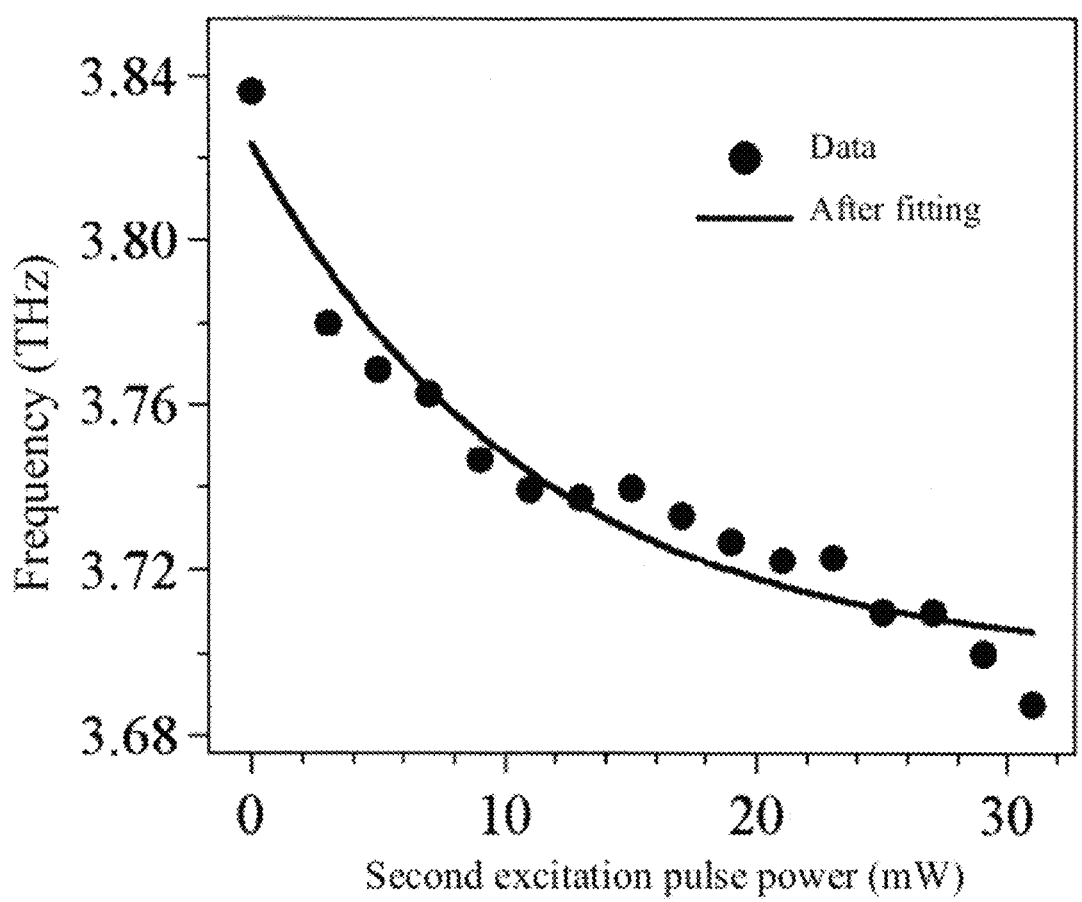
FIG. 7 Graph showing how the phonon frequency changes when the intensity of the second excitation pulse in double pulses is changed.

Furthermore, FIG. 7 shows how the coherent phonon frequency changes when the optical intensity of the second pulse in the laser pulse train is changed while keeping the time interval of laser pulse trains constant (Δt=276 fs).

As the optical intensity of the second pulse increases, the $A_1$ mode frequency due to the $GeTe_4$ structure gradually shifts toward the low-frequency side and reaches approx. 3.7 THz at approx. 31 mW. This result demonstrates that the phase change is successively controlled according to the level of optical intensity of the second pulse.

EXAMPLE 2

Example 2 of the phase change device having phase change recording film and phase change switching method for phase change recording film conforming to the present invention is explained based on the configuration shown in FIG. 8. The configuration of Example 2 is basically the same as that of Example 1, except that the phase change device having phase change recording film conforming to the present invention is applied as a switch that turns on/off electrical current.

In other words, the phase change device in Example 2 is constituted as a switch 15 that controls conduction of electrical current, as shown in FIG. 8, where the phase change recording film, which is a phase change device, is irradiated with the first pulse of the laser pulse train (double pulses) shaped from a femtosecond pulse laser to generate coherent phonons, after which the second pulse is irradiated to implement optical control and forcibly cause phase change at ultrahigh speed in femtoseconds, thereby changing the conductivity.

The constitution of the phase change unit 14 in Example 2 is the same as that in Example 1 and therefore not explained here. In Example 2, however, the optical waveguide 17 formed on the silicon wafer 16 has a diameter of 10 μm.

Also in Example 2, the GeTe and $Sb_2Te_3$ phase change thin films 19 constituting the phase change recording film 18 have a thickness of approx. 1 nm per layer, respectively. As shown in FIG. 8, Al (aluminum) electrodes 20 are positioned above and below the phase change recording film 18, to which a DC voltage of 3 V is applied, and an ammeter 22 is inserted into a circuit 21.

In this configuration, the phase change recording film 18 had also been reset (to an amorphous state) beforehand using a 0.2-mA current pulse of 5 ns in pulse duration, etc., as described in Patent Literature 10. A femtosecond pulse laser with a center wavelength of 850 nm (frequency of approx. 350 THz) was shaped into laser pulse trains (double pulses) using a Michelson interferometer of the same constitution as in Example 1, with the time interval Δt of laser pulse trains set to 276 fs (=3.62 THz).

Then, these laser pulse trains (double pulses) were irradiated onto the end face of the phase change recording film 18 via the optical fiber 4, coupling element 24 (or coupling agent), optical waveguide 17, and coupling element 23 (or coupling agent).

When the device resistance of the phase change recording film was measured before and after the irradiation of laser pulse trains (double pulses) shaped from the femtosecond pulse laser onto the phase change recording film, the resistance was 1 MΩ before the irradiation and 10 kΩ after the irradiation, demonstrating that the phase change recording film indeed functions as a switch that turns on/off electrical current by means of phase change.

(Measurement Example 1 Under Different Conditions)

An example of the phase change unit 14 in FIG. 8 having the same configuration as in Example 2 is explained below, where the excitation pulse of the laser pulse train does not resonate with the lattice vibration of the phase change recording film 18 depending on how the conditions of laser pulse trains shaped from the femtosecond pulse laser are set.

As in Example 2, an optical waveguide 17 of 10 μm in diameter was formed on a silicon wafer 16, and a phase change unit 14 having a phase change recording film 18 constituted by a repetitive structure of GeTe/$Sb_2Te_3$ phase change thin films 19 was produced on one end face of this optical waveguide 17, with the GeTe and $Sb_2Te_3$ phase change thin films 19 having a thickness of 1 nm per layer, respectively. Electrodes 20 constituted by Al were positioned above and below the phase change unit 14, to which a DC voltage of 3 V was applied, and an ammeter 22 was inserted into a circuit 21.

The phase change recording film 18 had been reset (to an amorphous state) beforehand using a 0.2-mA current pulse of 5 ns in pulse interval, etc., and a femtosecond pulse laser with a center wavelength of 850 nm (frequency of approx. 350 THz) (full width at half maximum of approx. 20 fs and intensity of 31 mW) was shaped into laser pulse trains (double pulses) using a Michelson interferometer, with the time interval Δt of laser pulse trains set to 160 fs (=6.25 THz), after which the laser pulse trains were irradiated onto the end face of the phase change recording film 18 via the optical fiber 4, coupling element 24 (or coupling agent), optical waveguide 17, and coupling element 23 (or coupling agent).

When the device resistance was measured before and after the irradiation of laser pulse trains shaped from the femtosecond pulse laser, the resistance was 1 MΩ before the irradiation and also 1 MΩ after the irradiation. This means that, depending on the time interval Δt of laser pulse trains, the cycle frequency of laser pulse trains does not resonate with the vibration frequency of the phase change recording film and therefore phase change does not occur in the phase change recording film.

Accordingly, it is necessary under the present invention to set the time interval Δt of laser pulse trains (double pulses) in a manner allowing the cycle frequency of laser pulse trains to resonate with the vibration frequency of the phase change recording film, and in this sense setting the time interval Δt to 276 fs, for example, is a significant condition in Example 2.

(Measurement Example 2 Under Different Conditions)

In Measurement Example 2, a single-layer $Ge_2Sb_2Te_5$ phase change thin film was used, instead of one having a super-lattice structure, as the phase change recording film in which to cause phase change. A film having a single-layer structure was used to show that the same control principles could be applied with both a multi-layer structure and a single-layer structure, and there is no fundamental difference. An example of a phase change unit constituted by this phase change recording film formed on a silicon wafer is explained below, where, depending on how the conditions of laser pulse trains shaped from the femtosecond pulse laser are set, the incident power of laser pulse trains will not exceed the activation energy required by phase change.

As in Example 2, the phase change recording film had an optical waveguide 17 of 10 μm in diameter formed on a silicon wafer 16. As mentioned earlier, the phase change recording film was a single-layer $Ge_2Sb_2Te_5$ phase change thin film 19 whose thickness was adjusted to the same as the overall thickness of the phase change thin recording film 19 having a layered super-lattice structure described in Example 2. Next, DC voltage of 3 V was applied and an ammeter was inserted into the circuit, as in Example 2.

The phase change recording film had been reset (to an amorphous state) beforehand, and a femtosecond pulse laser with a center wavelength of 850 nm (frequency of approx. 350 THz) (full width at half maximum of approx. 20 fs and intensity of 5 mW) was shaped into laser pulse trains (double pulses) using a Michelson interferometer, with the time interval Δt of laser pulse trains set to 276 fs (=3.62 THz), after which the laser pulse trains were irradiated onto the end face of the phase change recording film 18 via the fiber 4, coupling element 24 (or coupling agent), optical waveguide 17, and coupling element 23 (or coupling agent).

When the device resistance was measured before and after the irradiation of laser pulse trains shaped from the femtosecond pulse laser, the resistance was 1 MΩ before the irradiation and also 1 MΩ after the irradiation. This is probably because the intensity of the femtosecond pulse laser was set differently from Example 2 to 5 mW and therefore the incident power of laser pulse trains could not exceed the activation energy required by phase change.

Accordingly, setting the intensity of the femtosecond pulse laser to 31 mW, in addition to setting the time interval Δt of laser pulse trains (double pulses) to 276 fs, is a significant condition in Example 2.

The above explained the best mode for carrying out the present invention using examples, but the present invention is not at all limited to these examples and it goes without saying that various examples are available within the scope of technical items described in "What Is Claimed Is."

INDUSTRIAL FIELD OF APPLICATION

According to the present invention, phase change from amorphous to crystalline states in Ge—Sb—Te materials already put to practical applications such as DVD-RAMs can be caused with a small power of approx. 31 mW that can be easily achieved with a fiber-type femtosecond pulse laser, and at ultrahigh speed of 280 fs or less, without having to use a large-scale laser system such as a femtosecond regenerative amplifier.

Accordingly, the present invention can be utilized not only as an optical recording device applicable to DVD-RAMs, etc., but also as an ultrahigh-speed optical switch device that works in the terahertz range by controlling the motion of atoms or even as a completely new large-capacity solid-state memory device integrating optical and electronic means to enable recording-erasing at terahertz speed.

In addition, such an ultrahigh-speed optical switch of terahertz frequency can completely change the existing optical relays involving light-electricity conversion that present optical communication problems, thereby achieving baud rates of 1 Tbit/s or more, far faster than what is allowed by current optical communications (approx. 160 Gbit/s).

DESCRIPTION OF THE SYMBOLS

1 Femtosecond pulse laser feed unit
2 Light source
3 Michelson interferometer
4 Optical fiber
5 Half-mirror
6, 7 Two mirrors
8 Switching shutter
9 Coupling element
10 Moving mirror
11 Beam splitter to split laser into excitation light and probe light
12 Beam splitter to combine excitation light and probe light again
14 Phase change unit
15 Switch
16 Silicon wafer
17 Optical waveguide
18 Phase change recording film
19 Phase change thin film
20 Electrode
21 Circuit
22 Ammeter
23, 24 Coupling element
25 Motorized stage

What is claimed is:

1. A phase change switching method for causing phase change in a phase change recording film by irradiating a femtosecond pulse laser onto a phase change recording film which is Ge—Sb—Te material;
wherein one femtosecond pulse is split into pulse trains each having multiple pulses and the pulse trains are irradiated by matching a time interval of the multiple pulses with a time period of lattice vibration of a material constituting the phase change recording film and by adjusting an intensity of a second pulse of the multiple pulses after the time interval, thereby inducing non-thermal phase change in the phase change recording film, said non-thermal phase change being defined as a change confirmed by measuring the $A_1$ mode frequency after cutting the second pulse; and
the time interval of the pulse trains corresponds to a characteristic vibration frequency in a phonon mode that manifests prominently after the phase change from amorphous to crystalline or from crystalline to amorphous states, wherein the time interval of the pulse trains is set in a range of 270 fs to 278 fs for phase change from amorphous to crystalline states, and is set at around 263 fs for phase change from crystalline to amorphous states.

2. A phase change switching method for causing phase change in a phase change recording film according to claim 1, wherein the femtosecond pulse laser is split by a Michelson interferometer, Mach-Zender interferometer, or pulse shaper using liquid crystal optical modulation elements, and shaped into pulse trains having a femtosecond time interval.

3. A phase change switching method for causing phase change in a phase change recording film according to claim 1, wherein the material constituting the phase change recording film is $Ge_2Sb_2Te_5$ and the time interval Δt of the pulse trains is set to 276 fs (frequency of 3.62 THz) according to a time period of lattice vibration locally present in a $GeTe_4$ lattice containing a Ge atom.

4. A phase change switching method for causing phase change in a phase change recording film by irradiating a femtosecond pulse laser onto a phase change recording film which is Ge—Sb—Te material;
wherein one femtosecond pulse is split into pulse trains each having a first pulse and a second pulse and the pulse trains are irradiated by matching a time interval of the first and second pulses corresponding to a time interval of the pulse trains with a time period of lattice vibration of a material constituting the phase change recording film and by adjusting an intensity of the second pulse, thereby inducing non-thermal phase change in the phase change recording film, said non-thermal phase change being defined as a change confirmed by measuring the $A_1$ mode frequency after cutting the second pulse; and
the time interval of the pulse trains corresponds to a characteristic vibration frequency in a phonon mode that manifests prominently after the phase change from amorphous to crystalline or from crystalline to amorphous states, wherein the time interval of the pulse trains is set in a range of 270 fs to 278 fs for phase change from amorphous to crystalline states, and is set at around 263 fs for phase change from crystalline to amorphous states.

5. A phase change switching method for causing phase change in a phase change recording film according to claim 4, wherein a condition of the phase change is controlled by changing an intensity of the second pulse.

6. A phase change switching method for causing phase change in a phase change recording film according to claim 4, wherein the femtosecond pulse laser is split by a Michelson interferometer, Mach-Zender interferometer, or pulse shaper using liquid crystal optical modulation elements, and shaped into pulse trains having a femtosecond time interval.

7. A phase change switching method for causing phase change in a phase change recording film according to claim 4, wherein the material constituting the phase change recording film is $Ge_2Sb_2Te_5$ and the time interval $\Delta t$ of the pulse trains is set to 276 fs (frequency of 3.62 THz) according to a time period of lattice vibration locally present in a $GeTe_4$ lattice containing a Ge atom.

* * * * *